(12) United States Patent
Northrup et al.

(10) Patent No.: US 9,660,134 B1
(45) Date of Patent: May 23, 2017

(54) NITRIDE SEMICONDUCTOR POLARIZATION CONTROLLED DEVICE

(71) Applicant: Palo Alto Research Center Incorporated, Palo Alto, CA (US)

(72) Inventors: John E. Northrup, Palo Alto, CA (US); Thomas Wunderer, Palo Alto, CA (US); Jeng Ping Lu, Fremont, CA (US); Noble M Johnson, Menlo Park, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 15/094,639

(22) Filed: Apr. 8, 2016

(51) Int. Cl.
  *H01L 29/12* (2006.01)
  *H01L 21/338* (2006.01)
  *H01L 33/00* (2010.01)

(52) U.S. Cl.
  CPC ...... *H01L 33/0025* (2013.01); *H01L 33/0016* (2013.01)

(58) Field of Classification Search
  CPC .................................................. H01L 33/0025
  USPC ....... 438/94, 141, 172, 191, 220; 257/10–23
  See application file for complete search history.

(56) References Cited

U.S. PATENT DOCUMENTS

| | | | | |
|---|---|---|---|---|
| 7,863,648 B2 * | 1/2011 | Miyamoto | ............ | H01L 29/402 257/189 |
| 8,338,860 B2 * | 12/2012 | Bhalla | ................. | H01L 29/1029 257/192 |
| 8,785,976 B2 * | 7/2014 | Nakajima | ......... | H01L 29/42316 257/192 |
| 9,401,455 B1 * | 7/2016 | Zhang | ................... | H01L 33/325 33/405 |

(Continued)

OTHER PUBLICATIONS

Krishnamoorthy et al., "Polarization-engineered GaN/InGaN/GaN tunnel diodes", Appl. Phys. Lett, 97, 2010, 11 pages.

(Continued)

*Primary Examiner* — Calvin Lee
(74) *Attorney, Agent, or Firm* — Hollingsworth Davis, LLC

(57) ABSTRACT

A polarization controlled device has a first layer comprising a group III-nitride semiconductor substrate or template; a second group III-nitride semiconductor layer disposed over the group III-nitride semiconductor substrate or template; a third group III-nitride semiconductor layer disposed over the second group III-nitride semiconductor layer; and a fourth group III-nitride semiconductor layer disposed over the third group III-nitride semiconductor layer. A pn junction is formed at an interface between the third and fourth group III-nitride semiconductor layers. A polarization heterojunction is formed between the second group III-nitride semiconductor layer and the third group III-nitride semiconductor layer. The polarization junction has fixed charges of a polarity on one side of the polarization junction and fixed (Continued)

charges of an opposite polarity on an opposite side of the polarization junction. When unbiased, the pn junction comprises a first electric field that opposes the flow of carriers across the pn junction and the polarization junction comprises a second electric field that opposes the flow of oppositely charged carriers across the polarization junction.

22 Claims, 14 Drawing Sheets

(56) References Cited

U.S. PATENT DOCUMENTS

2010/0097105 A1    4/2010   Morita et al.
2013/0126942 A1    5/2013   Nakajima et al.
2015/0279961 A1   10/2015   Huang et al.

OTHER PUBLICATIONS

Li et al., "Polarizaiton-Engineer III-Nitride Heterojunction Tunnel Field-Effect Transistors", IEEE Journal on Exploratory Solid-Stste Computational Devices and Circuits, vol. 1, Jul. 16, 2015, pp. 28-34.

Madathil, "Polarization junctions increase nitride transistor breakdown voltage", Semiconductor Today, vol. 6, Issue 3, Apr./May 2011, pp. 98-99.

Nakajima et al., "High Density Two-Dimensional Hole Gas Induced by Negative Polarization at GaN/AlGaN Heterointerface", The Japan Society of Applied Physics, vol. 3, No. 12, Dec. 10, 2010, 3 pages.

* cited by examiner

NITRIDE SEMICONDUCTOR POLARIZATION CONTROLLED DEVICE

TECHNICAL FIELD

This disclosure relates generally to semiconductor devices and to circuits employing such devices.

BACKGROUND

Semiconductor devices such a diodes, bipolar transistors, metal oxide field effect transistors (MOSFETS), and insulated gate bipolar transistors (IGBT) can be used as semiconductor switches. Semiconductor switching devices generally do not conduct an appreciable amount of current until a non-zero switch on voltage is reached. Above the switch on voltage, the device conducts a relatively large current through a non-zero on resistance.

SUMMARY

Some embodiments described herein are directed to a polarization controlled device having a first layer comprising a group III-nitride semiconductor substrate or template; a second group III-nitride semiconductor layer disposed over the group III-nitride semiconductor substrate or template; a third group III-nitride semiconductor layer disposed over the second group III-nitride semiconductor layer; and a fourth group III-nitride semiconductor layer disposed over the third group III-nitride semiconductor layer. A pn junction is formed at an interface between the third and fourth group III-nitride semiconductor layers. A polarization heterojunction is formed between the second group III-nitride semiconductor layer and the third group III-nitride semiconductor layer. The polarization junction has fixed charges of a polarity on one side of the polarization junction and fixed charges of an opposite polarity on an opposite side of the polarization junction. When unbiased, the pn junction comprises a first electric field that opposes the flow of carriers across the pn junction and the polarization junction comprises a second electric field that opposes the flow of oppositely charged carriers across the polarization junction.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Embodiments described herein involve a semiconductor device that can be used in various applications, such as a switch, a sensor, or an oscillator. The device includes a first nitride semiconductor layer that serves as a device substrate, with second, third, and fourth nitride semiconductor layers disposed in that order on the substrate layer. A pn junction is formed by the junction interface between the third and fourth layers. A polarization junction is formed by the heterojunction interface between the second and third layers, wherein the term "heterojunction" denotes that the second and third layers are made of dissimilar materials. The polarization junction has fixed charges of a polarity on one side of the heterojunction and fixed charges of the opposite polarity on the opposite side of the heterojunction. When the device is unbiased, the pn junction comprises a first electric field that opposes the flow of carriers across the pn junction and the polarization junction comprises a second electric field that opposes the flow of oppositely charged carriers across the polarization junction. The polarization junction controls the flow of carriers through the pn junction, thus, the devices disclosed herein are referred to as polarization controlled diodes (PCDs).

Figure 1A:
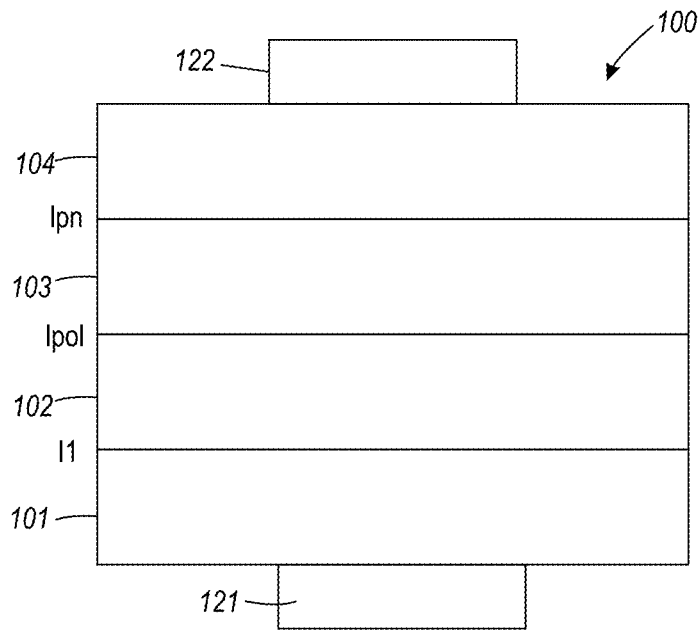
FIG. 1A is a polarization controlled device (PCD) in accordance with some embodiments.

FIG. 1A is a schematic cross sectional diagram of a PCD 100 in accordance with some embodiments. The PCD 100 is shown as a vertical device with p- and n-contacts on opposite sides. It is possible, however, to have both contacts on the same side with the n-GaN substrate/template is exposed through etching, e.g., dry etching. As shown in FIG. 1A the device 100 may consist of several layers 101-104 of group III-nitride semiconductors disposed between p and n-contact electrodes 121, 122. A pn junction is formed at the junction interface, Ipn, between the third 103 and fourth 104 nitride semiconductor layers. In some embodiments, the junction, Ipn, may be a pn homojunction meaning that the third and fourth layers are made of the same type of material. The third layer 103 is doped with a first type of dopant, either acceptor (p-type) or donor (n-type), and the fourth nitride semiconductor layer 104 doped with the opposite type of dopant, such that the interface Ipn forms a pn junction. A polarization junction is formed at the heterojunction, Ipol, between the second nitride semiconductor layer 102 and a third nitride semiconductor layer 103. The device 100 also includes a third interface, I1, between the first 101 and second 102 nitride semiconductor layers.

In some embodiments, the second nitride semiconductor layer is n-doped, the third nitride semiconductor layer is n-doped, and the fourth nitride semiconductor layer is p-doped. A doping concentration of n-doped layers may be on the order of $10^{18}$ to $10^{19}$ and a doping concentration of p-doped layers may be on the order of $10^{19}$ to $10^{20}$.

Alternatively, in some embodiments, the second nitride semiconductor layer is p-doped, the third nitride semiconductor layer is p-doped, and the fourth nitride semiconductor layer is n-doped. In some embodiments, the second nitride semiconductor layer may have a dopant concentration of the same order of magnitude as the third nitride semiconductor layer with the same doping concentrations as those indicated in the paragraph above.

In some embodiments, the distance between the polarization junction and the pn junction can be between 25 nm and 500 nm, for example.

Figure 1B:
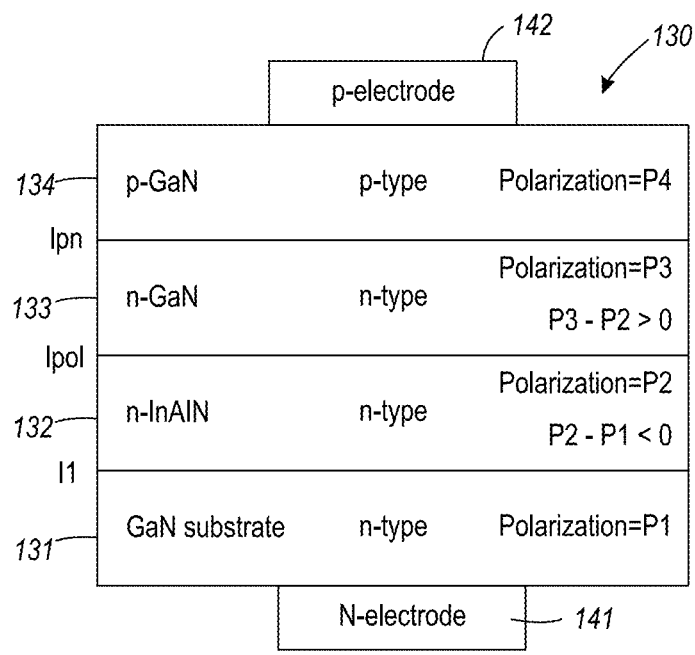
FIG. 1B is a PCD having an InAlN/GaN polarization junction in accordance with some embodiments.

As illustrated by the PCD 130 of FIG. 1B, the fourth nitride semiconductor layer 134 may be p-GaN doped with a p-type dopant, the third nitride semiconductor layer 133 may be GaN doped with an n-type dopant; and the first layer 131 may be an n-type doped GaN substrate. The second nitride semiconductor layer 132 may be a different nitride semiconductor material than the semiconductor material of the first layer and the third layer, e.g., n-InAlN. An n-contact 141 is disposed proximate the first layer 131 and a p-contact is disposed proximate the fourth layer 134.

In some embodiments, the material of the second layer may be a nitride semiconductor that comprises Al, e.g., InAlN as shown in FIG. 1B. Alternatively, the material of the second layer may be AlGaN which is doped with a p-type or n-type dopant. In some embodiments, the material of the second layer is a quarternary nitride semiconductor such as AlGaInN. The second nitride semiconductor layer 132 can be an $In_xAl_{1-x}N$ layer, where x is between 0.10 and 0.25. The second nitride semiconductor layer 132 can be lattice matched to the substrate layer 131. For example, where the first layer 131 is n-type GaN and the second layer 132 is n-type InAlN, the lattice matching may involve choosing the In composition in the InAlN layer to be about 18%. The device 130 is grown along the c-plane (0001) of the GaN substrate 131, although other substrate orientations are also possible. A higher crystalline quality may achieved when the layers are pseudomorphically grown onto a low defect density substrate, e.g., the lattice constant of the epitaxial film substantially equal to the lattice constant of the substrate. When the lattice constant of the epitaxial layers is close to the lattice constant of the substrate the layers do not build up strain that might eventually be released through the formation of defects (threading dislocations). Furthermore, the piezoelectric polarization is dependent on the strain within the epi film. FIG. 1B shows a PCD having an NNNP structure, meaning that layers 1, 2, 3, are doped n-type and layer 4 is doped p-type. In some embodiments, a PCD may have a PPPN, a NPPP, or a NNPP structure. Si may be used as the n-type dopant and the Si concentration in the n-type layers, e.g., the first, second, and third layers 101, 102, 103 of PCD 130, may be in a range of $N_D=1\times10^{18}$ to $1\times10^{19}$ Si/cm$^3$. Mg may be used as the p-type dopant such that the Mg concentration in the p-layer, e.g., the fourth layer 104 of PCD 130, may be in a range of $N_A=1\times10^{19}$ to $1\times10^{20}$ Mg/cm$^3$. Any suitable n-type dopant, such as Ge, and any suitable p-type dopant could be used for doping the n-type and p-type layers.

The polarization junction of the PCDs described herein is formed at the heterojunction between the second and third layers of different nitride semiconductor materials. Due to their wurtzite crystal structure and ionicity, nitride semiconductors grown epitaxially along the (0001) plane exhibit piezoelectric and/or spontaneous polarization. At heterostructure interfaces, such as the Ipol and I1 interfaces, the polarization of the nitride semiconductors on either side of the interface leads to a polarization field that is a function of the sum of the piezoelectric and the spontaneous polarization field components of the nitride semiconductor materials that form the polarization junction.

As shown in FIG. 1B, the polarization of the first layer is P1, the polarization of the second layer is P2, and the polarization of the third layer is P3. The difference in the polarization at I1 is P2-P1 which is less than zero when the first layer is GaN and the second layer is InAlN as in the illustrated embodiment. The difference in polarization at Ipol is P3-P2 which is greater than zero for the materials illustrated in FIG. 1B. Application of a voltage across the device 130 between the p-electrode 141 and the n-electrode 142 results in a flow of current. The current flow is very low if the bias voltage is less than a switch-on voltage, Vs. The value of Vs will be determined by factors such as the doping levels, composition of the materials, and thicknesses of various layers. If the bias voltage is greater than Vs, the current quickly becomes very large. For example, a change in bias voltage of 0.005 V can lead to an increase in current density by a factor larger than $10^3$ or greater than $10^5$ or even greater than $10^7$. A difference between a bias voltage at which the device is switched off and the switch on voltage, Vs, may be less than about 0.01 volts or in a range between 0.002 and 0.01 volts, for example.

When the device of FIG. 1B is grown in the +c-direction P2−P1<0 and P3−P2>0. At the relevant interface going from AlInN to GaN (at position Ipol) the polarization abruptly changes, causing a polarization charge density to form. In the illustrated example, this polarization charge density is negative (−σ) and will cause repulsion of electrons. For applied bias voltage V less than $V_S$, the electrons are unable to surmount the energy barrier that forms at the interface between the second 132 and third 133 layers.

Figure 2:
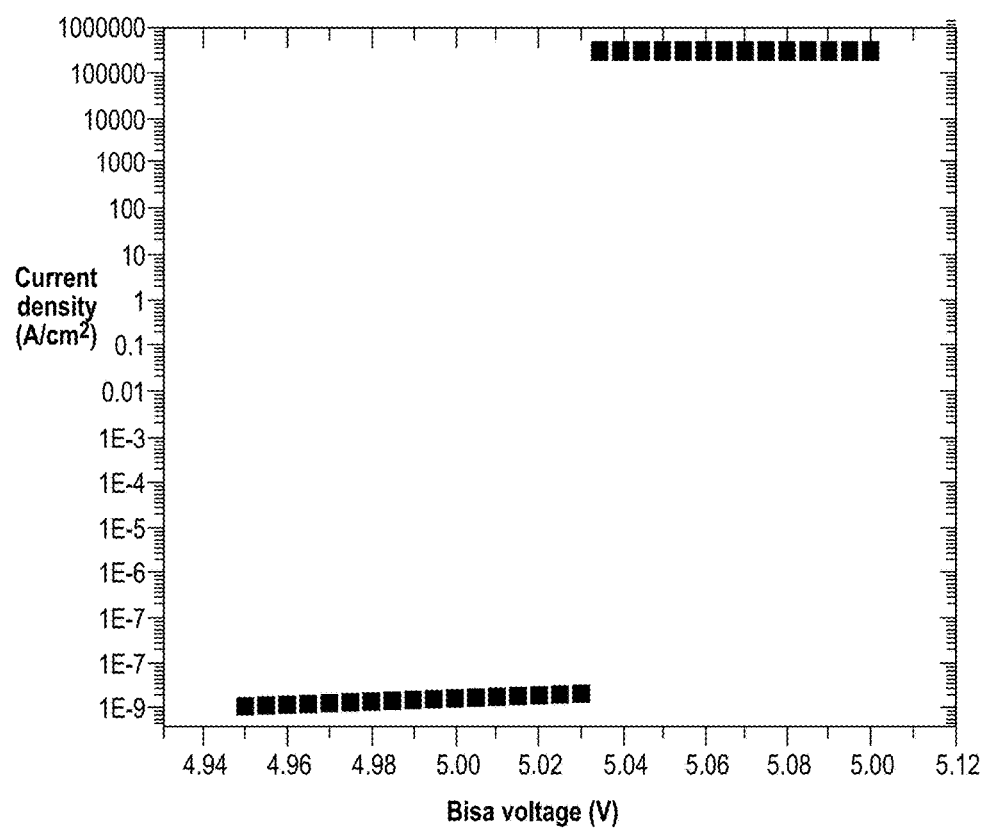
FIG. 2 is a calculated current-voltage (IV) characteristic of a PCD having an InAlN/GaN polarization junction.

There is also an energy barrier to hole transport in the −c direction across the n-GaN region between interface Ipol and interface Ipn. This energy barrier is associated with the pn junction and prevents holes from accumulating in sufficient numbers to screen the polarization charge at Ipol. The current flowing through the device 130 is very low under these conditions. Once the bias voltage exceeds the switch-on voltage $V_S$, the barrier for electron transport across the Ipol interface and the barrier for hole transport across the n-GaN layer 133 are reduced abruptly. This abrupt change in band structure is a cooperative effect. Hole accumulation at the Ipol interface reduces the energy barrier and allows some electrons to flow into the n-GaN layer 133 towards the pn junction. This flow of electrons reduces the barrier for hole transport and allows a further increase in hole density at the Ipol interface. This positive feedback results in a sharp reduction in both barriers Ipn and Ipol, and allows a large current to flow across the device 130. The potential barrier at Ipol may be reduced by more than 1 eV as the bias voltage is increased by 0.005 eV based on simulations. At the same time the energy barrier for the holes is reduced by 0.9 eV by the same increase in bias voltage. This is the origin of the sharp turn-on of the current. FIG. 2 shows the calculated current density as a function of bias voltage for a device having the configuration shown in FIG. 1 with a third layer of n-$In_{0.18}Al_{0.82}N$. In this example simulation, a change in bias voltage of less than 0.05V leads to an increase in current density by a factor larger than $10^3$.

Figure 3A:
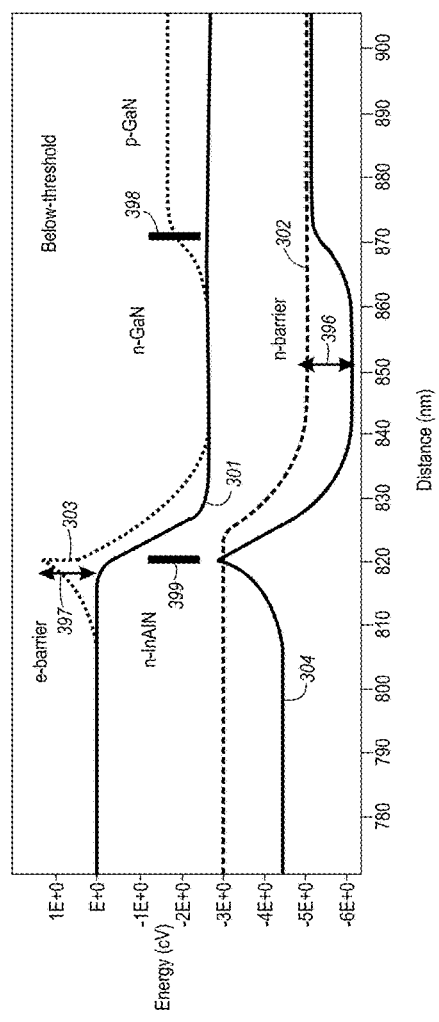
FIGS. 3A and 3B are simulated band structure diagrams of the energy (eV) as a function of distance in the PCD of FIG. 1B.
Figure 3B:
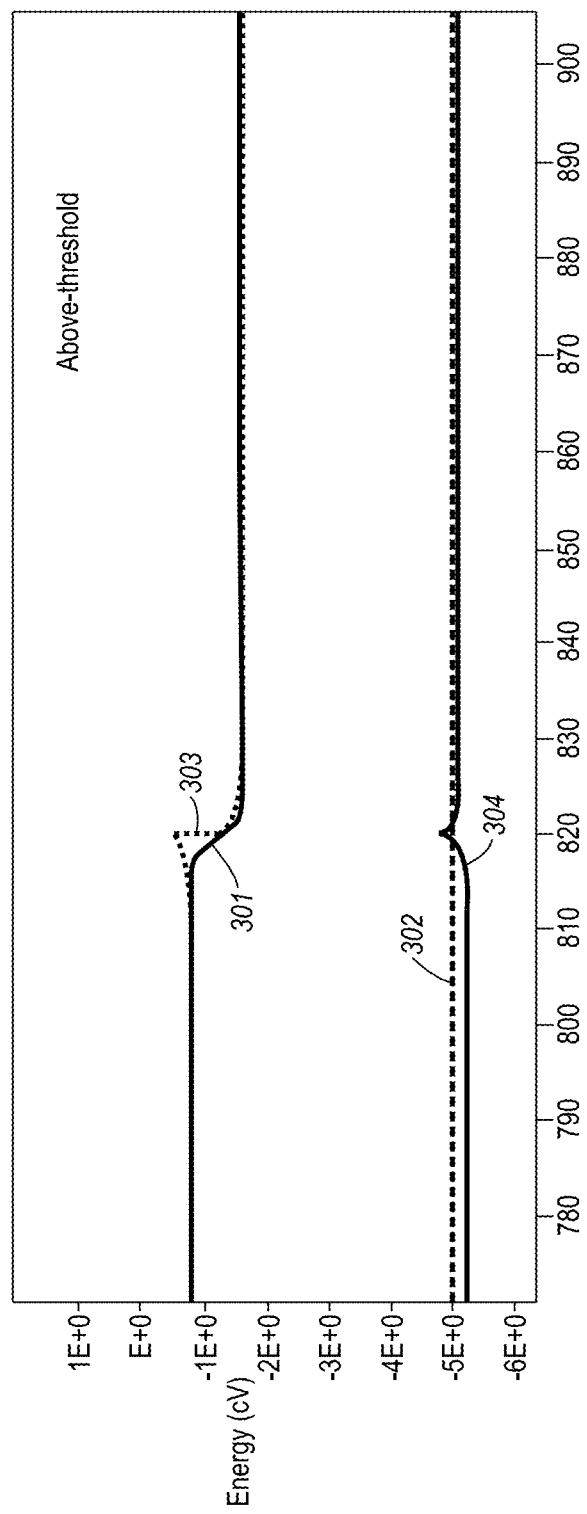

Simulated band structure diagrams of the energy (eV) as a function of distance in the PCD of FIG. 1B along the +c axis corresponding to the off-state (Vbias=5.03 V) and the on-state (Vbias=5.035 V) are shown in FIGS. 3A and 3B, respectively. The bias voltage is 5.03 V in FIG. 3A (the off state). The bias voltage in FIG. 3B (the on state) is 5.035 V.

In this case the current flow is large. The vertical dashed lines in FIG. 3A denote the Ipol interface between n-InAlN and n-GaN (dashed line 399) and the Ipn interface between n-GaN and p-GaN (dashed line 398). The distance between these two interfaces is 50 nm.

The vertical lines terminated by arrows in FIG. 3A denote potential barriers seen by electrons (line 397) and holes (line 396). Line 301 in FIGS. 3A and 3B is the quasi-Fermi level for electrons. Line 302 in FIGS. 3A and 3B is the quasi-Fermi level for holes. Line 303 in FIGS. 3A and 3B is the conduction band edge. Line 304 in FIGS. 3A and 3B is the valence band edge.

As a test, an interlayer was placed between the n-InAlN layer and the n-GaN layer of a PCD to assess the effect of replacing the sharp interface by an interface in which there is an additional intermediate layer with an InGaAlN composition. In the first scenario, a sharp interface was tested with no interlayer at the interface between an $In_{0.18}Al_{0.82}N$ layer and an n-GaN layer. In a second scenario, a relatively gradual interface (Gradual 1) was tested wherein an interlayer of $In_{0.02}Al_{0.05}Ga_{0.90}N$ was disposed between an $In_{0.18}Al_{0.82}N$ layer and an n-GaN layer. In a third scenario, a relatively gradual interface (Gradual 2) was tested wherein an interlayer of $In_{0.02}Al_{0.08}Ga_{0.90}N$ was disposed between an $In_{0.18}Al_{0.82}N$ layer and an n-GaN layer. The results were very similar in each case: the change in current with bias voltage remains abrupt. The doping level in the layers was 6E18 Si/cm$^3$ in these examples. The results are listed in Table 1 below.

TABLE 1

| Interface | V-switch (V) | J-low (A/cm$^2$) | J-high (A/cm$^2$) |
|---|---|---|---|
| Sharp $In_{0.18}Al_{0.82}N$/GaN | 6.755 | 2.7 E-10 | 8.19 E5 |
| Gradual 1 $In_{0.18}Al_{0.82}N$/$In_{0.02}Al_{0.05}Ga_{0.93}N$/GaN | 6.745 | 6.7 E-10 | 8.18 E5 |
| Gradual 2 $In_{0.18}Al_{0.82}N$/$In_{0.02}Al_{0.08}Ga_{0.90}N$/GaN | 6.685 | 1.04 E-9 | 7.98 E5 |

Simulations for devices with n-$In_{0.18}Al_{0.82}N$ layer thicknesses of 400, 200, or 75 nm all show sharp turn-on characteristics similar to the turn-on characteristics shown in FIG. 2 suggesting the thickness of the n-$In_{0.18}Al_{0.82}N$ layer is not critical. The dependence of threshold voltage on thickness of the n-GaN is shown in Table 2 below. The threshold voltage depends on the thickness of the n-GaN region between Ipol and Ipn. In the off state this region acts as a barrier to hole transport. By making this region thicker the threshold voltage increases slightly. The Si doping level in the n-GaN and n-InAlN layers was about $8\times10^{18}$/cm$^3$ in this example.

TABLE 2

| Thickness of N-GaN (nm) | V-switch (V) |
|---|---|
| 40 | 4.65 |
| 50 | 4.77 |
| 60 | 4.82 |

Figure 4:
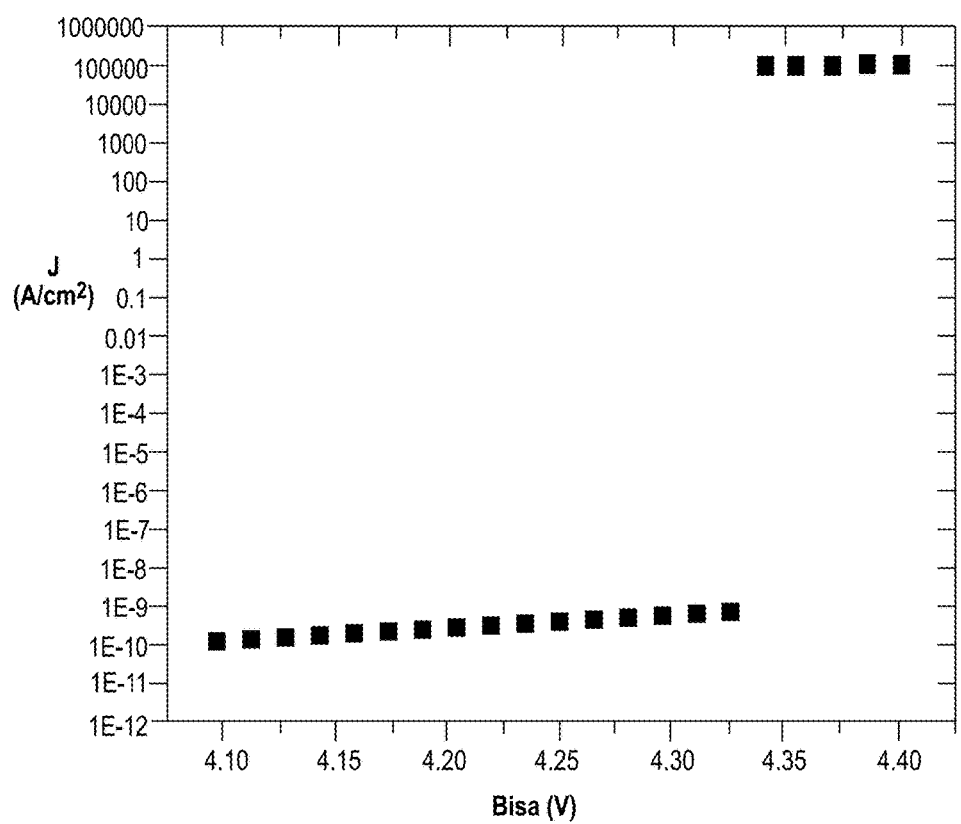
FIG. 4 shows a calculated IV curve for a device having an n-type InAlN/n-type GaN polarization junction with a doping level of $Si=9E18/cm^3$ in the n-GaN and n-InAlN layers in accordance with some embodiments.

The switch on voltage, Vs, depends on the doping level in the second and third layers, e.g., the n-InAlN and n-GaN layers shown in FIG. 1B. FIG. 4 shows a calculated IV curve for a device having for a doping level of Si=9E18/cm$^3$ in the n-GaN and n-InAlN layers. The switch-on voltage is about 4.33 V in this case. In contrast, FIG. 2 shows an IV curve for a device having a doping level of about $8\times10^{18}$/cm$^3$ in the n-GaN and n-InAlN layers. The switch on voltage for this doping level is about 5.035 volts.

Figure 5:
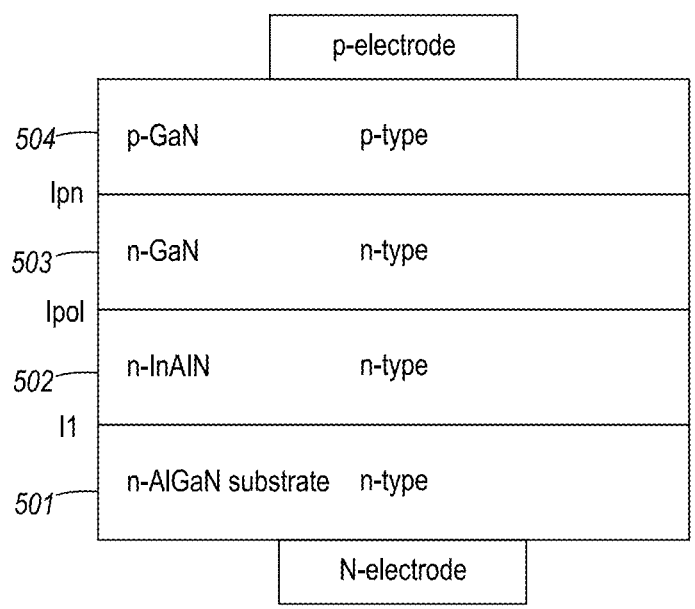
FIG. 5 is a PCD having an AlGaN/GaN polarization junction in accordance with some embodiments.
Figure 6:
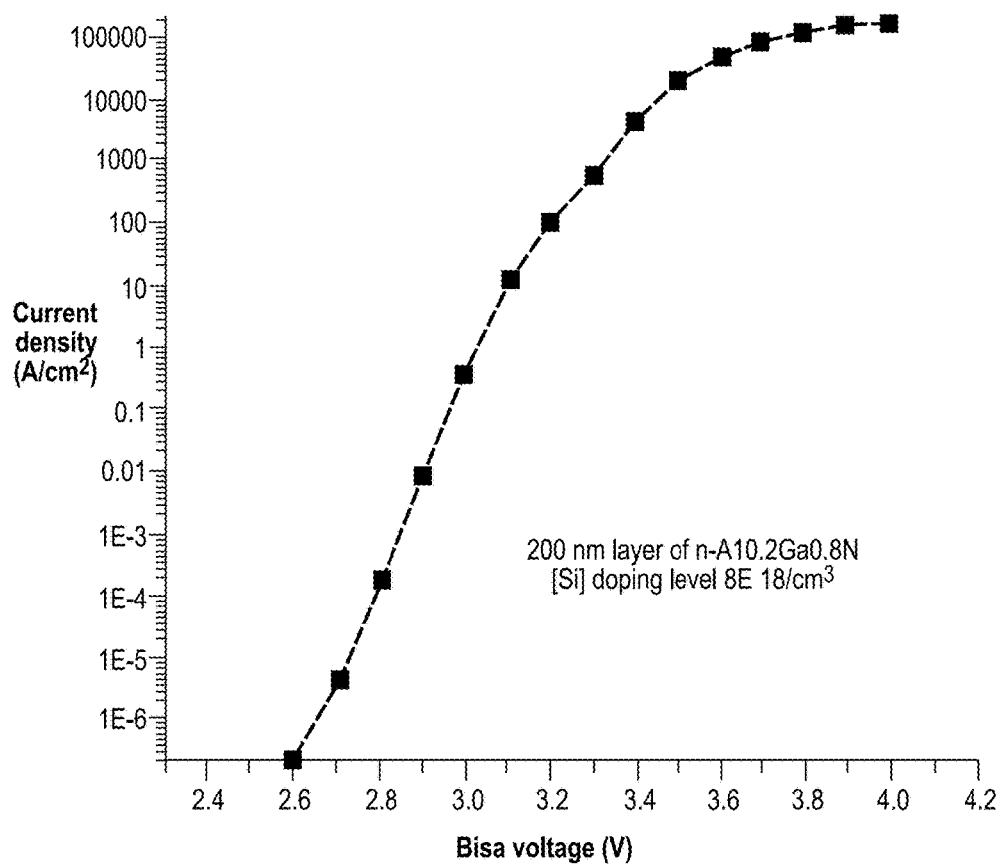
FIGS. 6, 7A, and 7B show calculated IV characteristics of PCDs having AlGaN/GaN polarization junctions in accordance with some embodiments.

FIG. 5 illustrates a PCD having a substrate layer 501 comprising n-type AlGaN, a second layer 502 comprising n-type AlGaN, a third layer 503 comprising n-type GaN, and a fourth layer 504 comprising p-type GaN. Although this example illustrates an AlGaN substrate, other substrates including GaN or AlN may be used. In some embodiments, a template, e.g., relaxed AlGaN film, disposed on a substrate, e.g., GaN, AlN, sapphire, SiC, Si and/or other materials may be used in the place of layer 501. A pn junction is formed by the homojunction interface, Ipn, between the third and fourth layers. A polarization junction is formed by the heterojunction interface, Ipol, between the second and third layers. The IV characteristic for a device having the structure of FIG. 5 with a second layer of 200 nm of $Al_{0.2}Ga_{0.8}N$ with Si doping level of 8E18/cm$^3$ is shown in FIG. 6. In this device, the current increases more gradually with bias voltage when compared with the device described in connection with FIG. 2. The sharp turn on is not seen in the PCD having the $Al_{0.2}Ga_{0.8}N$/GaN polarization interface. Up to several hundreds of nm of 20% AlGaN, e.g., up to about 400 nm, can be grown pseudomorphically on GaN substrate without relaxation or crack formation. For higher Al compositions or thick films the layers might crack when grown on GaN.

Differences in the operation of PCDs with an $Al_{0.2}Ga_{0.8}N$/GaN polarization heterojunction (see FIG. 6) and PCDs having an $In_{0.18}Al_{0.82}N$/GaN polarization heterojunction (see FIG. 2) is due to the change in polarization at the Ipol interface. In the $In_{0.18}Al_{0.82}N$/GaN device, the change in polarization at Ipol is $\Delta P=4.2\times10-2$ C/m$^2$ whereas the change in polarization at Ipol for the $Al_{0.2}Ga_{0.8}N$/GaN device is $\Delta P=1.5\times10-2$ C/m$^2$. The significantly larger $\Delta P$ in the case of an InAlN/GaN heterojunction increases the barrier for electrons to flow across this interface. This difference in $\Delta P$ is a source of the difference in IV characteristics in the two types of PCDs, wherein the larger $\Delta P$ leads to a sharper switch-on characteristic. In some embodiments, differences in polarization between the second and third nitride semiconductor layers greater than 2.0 C/m$^2$ or greater 3.0 C/m$^2$ lead to suitably sharp switch on IV characteristics.

Figure 7A:
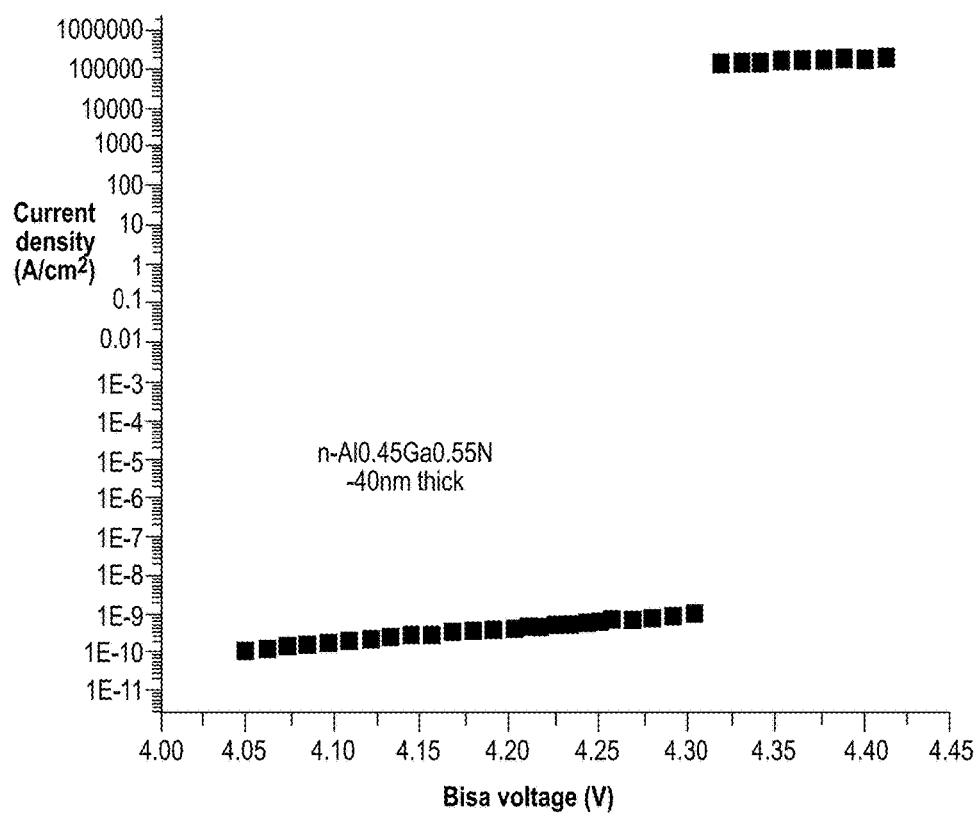
Figure 7B:
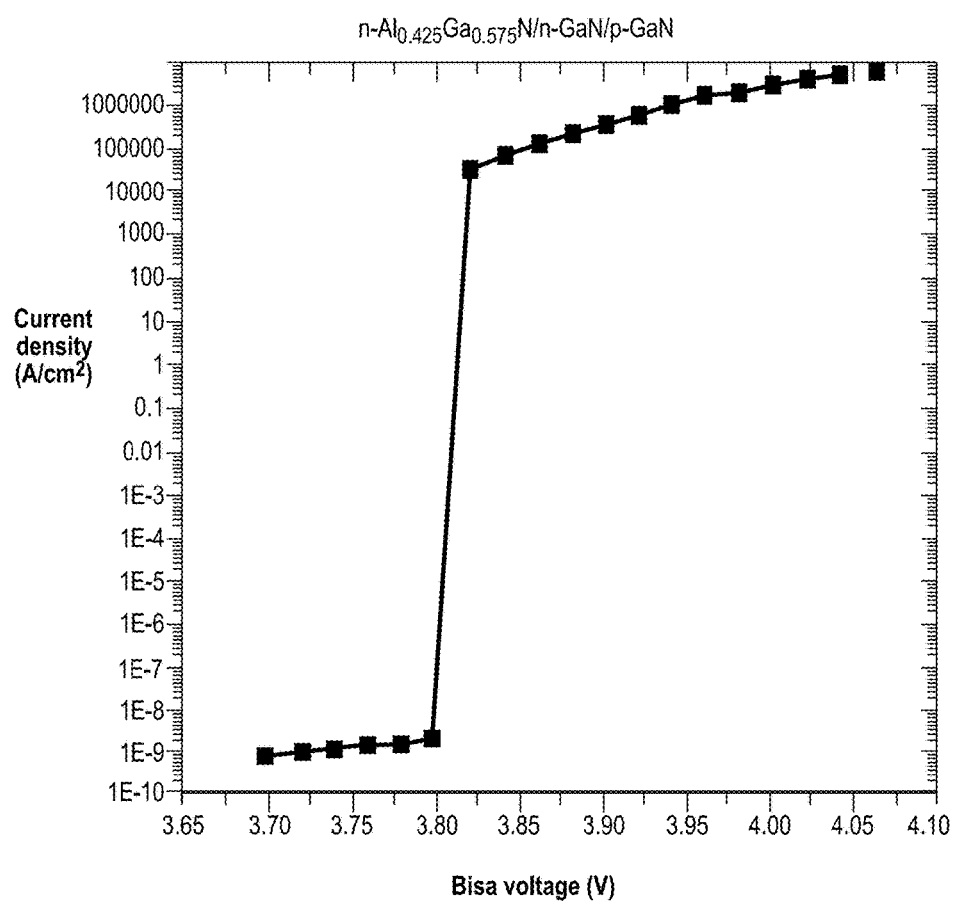

By increasing the Al composition to at greater than about 40%, greater than about 42.5% or greater than about 45% in the AlGaN layer it is possible to increase the change in polarization, $\Delta P$, at the Ipol interface for the AlGaN/GaN structure to a value similar to that observed for the PCD having the $In_{0.18}Al_{0.82}N$/GaN Ipol heterojunction interface. When the Al composition is at least 42.5% or at least about 45%, the sharp switch-on characteristic observed for the $In_{0.18}Al_{0.82}N$/GaN device structure is recovered. The IV curve shown in FIG. 7A was obtained for a PCD having the structure shown in FIG. 5 with a second layer 502 of 40 nm thick n-$Al_{0.45}Ga_{0.55}N$. FIG. 7B shows an IV curve of a PCD having the structure shown in FIG. 5 with a first layer 501 substrate of n-type $Al_{0.33}Ga_{0.67}N$, a second layer 502 of 75 nm thick n-$Al_{0.425}Ga_{0.575}N$, a third layer 503 of 50 nm thick n-type GaN, and a fourth layer 504 of 80 nm thick p-type GaN. The device of FIG. 7B has a more gradual switch on IV characteristic than the devices of FIG. 7A and FIG. 2.

Figure 8A:
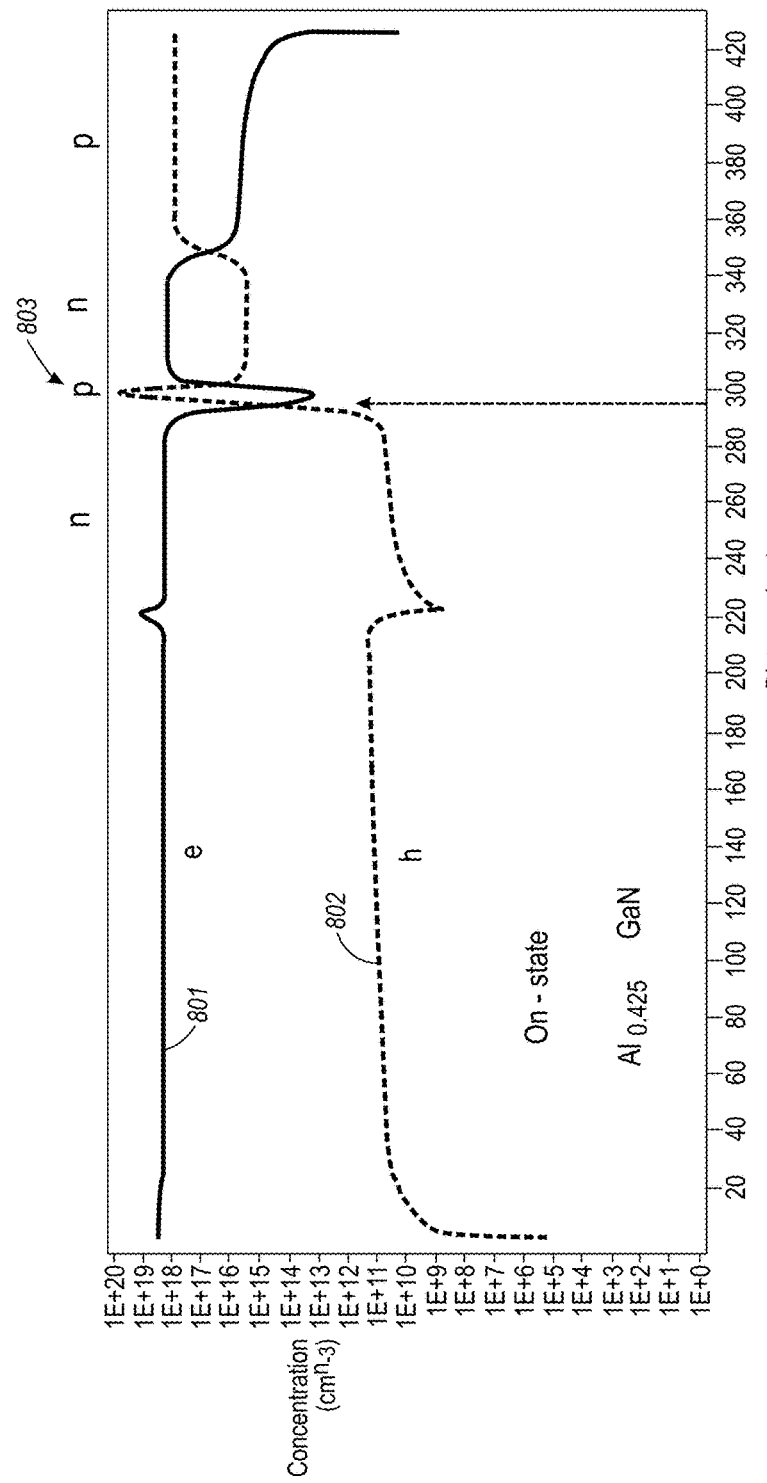
FIGS. 8A and 8B shows the free carrier concentration in a device comprising a GaN substrate, with n-$Al_{0.45}Ga_{0.55}N$, n-GaN, and p-GaN layers disposed on the substrate in accordance with some embodiments.
Figure 8B:
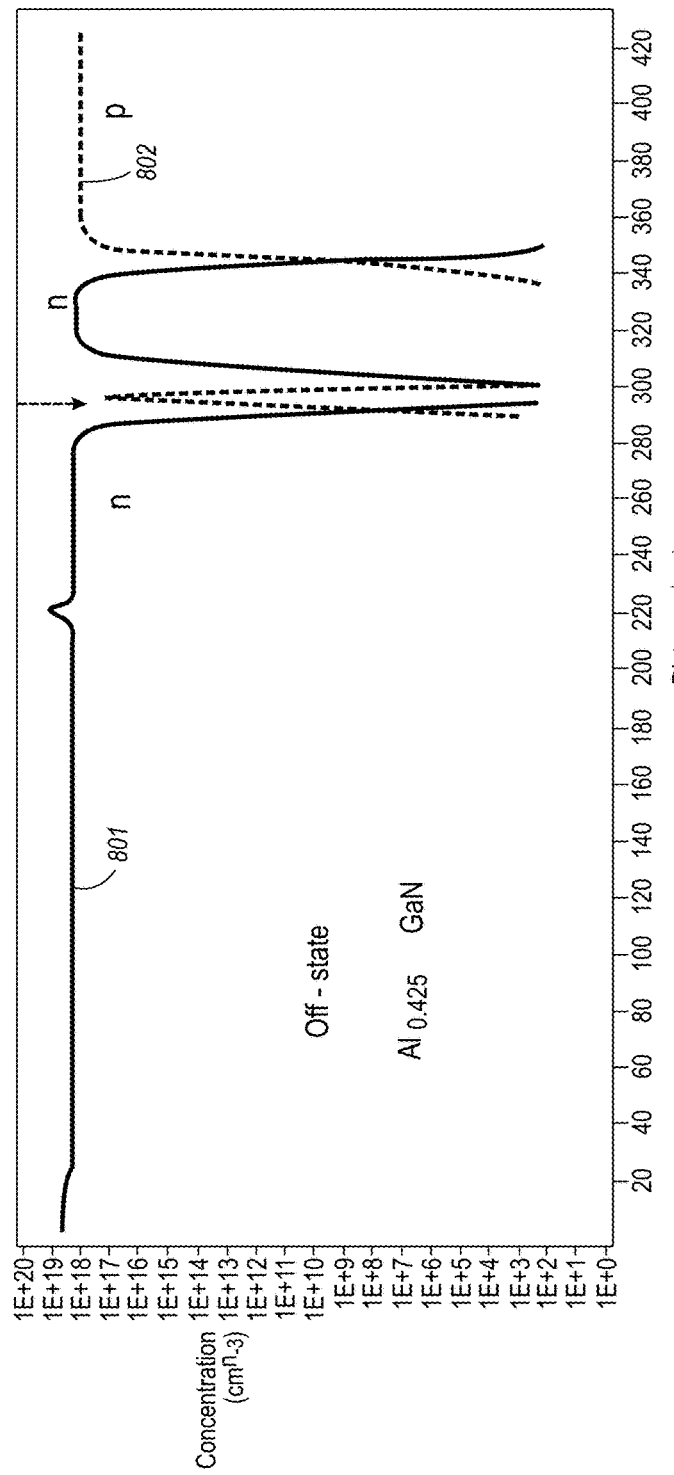

FIGS. 8A and 8B show the free carrier concentration in a device comprising a GaN substrate, with n-$Al_{0.45}Ga_{0.55}N$, n-GaN, and p-GaN layers disposed on the substrate in that order. FIG. 8A shows the electron 801 and hole 802 concentrations of the GaN substrate/n-$Al_{0.45}Ga_{0.55}N$/n-GaN/p-

GaN device when the device is in the on state. FIG. 8B shows the electron 801 and hole 802 concentrations of the GaN substrate/n-$Al_{0.45}Ga_{0.55}$N/n-GaN/p-GaN device when the device is in the off state. When the device is in the off state, shown in FIG. 8A, a parasitic P layer 803 forms between the n-$Al_{0.45}Ga_{0.55}$N and n-GaN layers. As illustrated in FIGS. 8A and 8B, the hole concentration in the parasitic P-layer 803 at the Ipol interface (between the n-$Al_{0.45}Ga_{0.55}$N and n-GaN layers) and the electron concentration at the Ipn junction interface (between n-GaN and p-GaN layers) both increase abruptly as the device turns on allowing the current to flow through both the Ipn and Ipol interfaces.

In some cases, it is possible to employ a quaternary layer rather than InAlN or AlGaN so long as there is a sufficiently large positive ΔP, e.g. ΔP>2.0 C/m² or ΔP>3.0 C/m², at the Ipol interface. For example, the quaternary material $In_{0.15}Al_{0.80}Ga_{0.05}$N can be used as layer 2 and n-GaN as layer 3 at the Ipol interface. A device with the $In_{0.15}Al_{0.80}Ga_{0.05}$N/n-GaN Ipol interface exhibits a sharp turn-on at around 6.0 V.

The PCD described above is suitable for a number of applications. For example the device may function as a sensor configured to detect an environmental condition. The device is configured so that exposure to the environmental condition causes the device to switch on or switch off. In various embodiments, the device may operate as a chemical sensor, a light sensor, a strain sensor, or a temperature sensor, for example.

Figure 9:
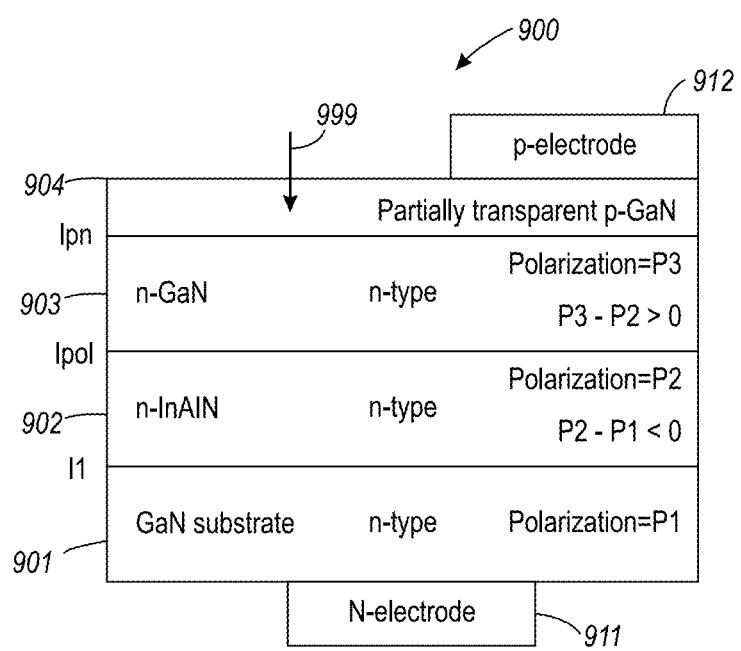
FIG. 9 illustrates a PCD configured as a ultraviolet light sensor in accordance with some embodiments.

In some applications, the PCD can be configured as a ultraviolet light sensor 900 as shown in FIG. 9. The light sensor 900 includes first 901, second 902, third 903, and fourth 904 nitride semiconductor layers disposed between electrodes 911, 912. The first nitride semiconductor layer 901 is a substrate upon which the second 902, third 903, and fourth 904 layers are epitaxially grown. The interface between the third 903 and fourth 904 layers, Ipn, forms a pn junction as previously discussed. The second 902 and third 903 layers are different types of nitride semiconductor materials. A polarization junction is formed at the interface, Ipol, between the second 902 and third 903 layers as previously discussed. In one example, the first layer 901 is n-type doped GaN, the second layer 902 is n-type doped InAlN, the third layer 903 is n-type doped GaN, and the fourth layer 904 is p-type doped GaN. The fourth layer 904 is partially transparent to light. Light can be transmitted through the fourth layer 904 as indicated by arrow 999. The light that enters the device 900 creates electron-hole pairs at near the Ipol interface.

Figure 10:
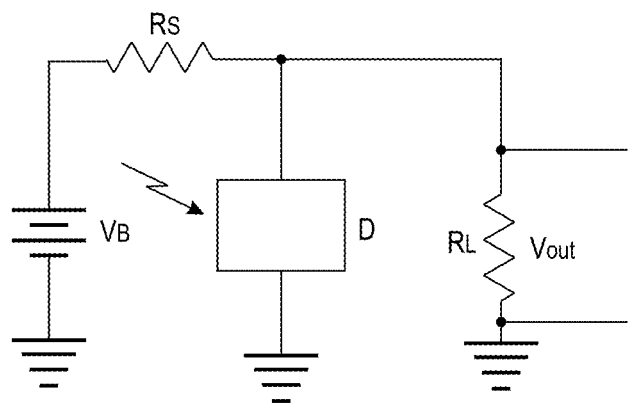
FIG. 10 is a schematic diagram illustrating operation of a device as a light sensor according to some embodiments.

FIG. 10 is a schematic diagram illustrating operation of a device 900 as a light sensor (indicated as device D in the schematic diagram) according to some embodiments. Optionally the device 900 may be biased near and below the switch on voltage $V_S$ through resistor Rs by bias source $V_B$. When the device is not exposed to light, the device is cut off and a relatively small current flows through the device. When the device is cut off, Vout is in the high state. When the device is exposed to light 1001, the light 1001 enters the device 900 through the transparent fourth layer 904 and creates electron-hole pairs at and/or near the polarization junction interface. The holes reduce the potential barrier and enable the device to switch on. When the device is switched on, it conducts current, reducing Vout to a low state.

In another application, the device may function as a temperature sensor. For example, as the device heats up, the switch on voltage, Vs, decreases. Table 3 shows the decrease in Vs with temperature for a PCD device having an n-$Al_{0.45}Ga_{0.55}$N/n-GaN interface at the polarization junction.

TABLE 3

| Temperature | Vs |
|---|---|
| 290 K. | 4.41 V |
| 300 K. | 4.32 V |
| 310 K. | 4.22 V |
| 320 K. | 4.13 V |

The devices described herein can be suitable for negative differential resistance applications wherein Δv/Δi<0. The band diagram shown in FIG. 3A is obtained in the device by taking advantage of the natural polarization charge at nitride polar hetero-interfaces. In PCDs described herein, before the switch on voltage is applied, the current is negligibly low. After switch on, the current is limited by the series resistance of the group III-N materials and the contact resistances. As illustrated by FIG. 3A, the voltage difference across the junction is reduced from 5V to about 4V after turn-on, indicating negative differential resistance. For example, the device disclosed herein exhibiting negative differential resistance can be used as an amplifier and/or oscillator, and/or in bistable applications such as switching devices and/or memory devices.

Figure 11:
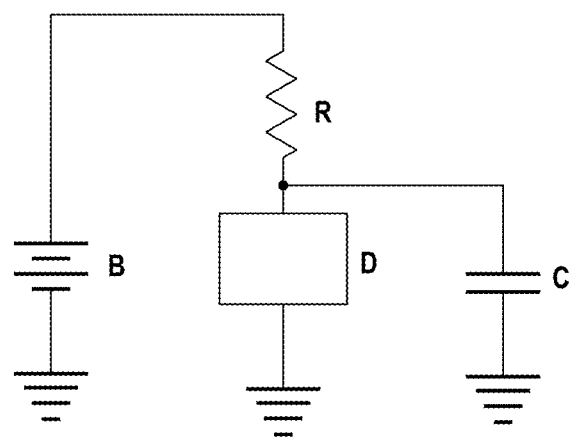
FIG. 11 shows a schematic diagram of a circuit which a PCD is used in an oscillator circuit in accordance with some embodiments.

The PCD disclosed herein can be employed in an oscillator circuit as illustrated in the circuit diagram of FIG. 11. Battery B charges capacitor C through resistor R until the turn on voltage of device D is reached at which point the device D will turn on sharply. This will lead to a reduction in voltage across C to a value below the threshold voltage. This will result in a saw tooth waveform generation Vout at the output terminal. In some embodiments, R can be replaced with an inductor for better efficiency. The oscillation frequency is dependent on voltage of the battery B and the values of R and C. When used in conjunction with appropriate circuitry, the device can be used to build a voltage controlled oscillator (VCO) or a phase locked loop (PLL)

The switch on voltage of the devices proposed herein have a switch on voltage of around 5V which is suitable for standard electronic devices. The proposed GaN devices can have much faster response times than other negative differential resistance devices such as a semiconductor DIAC because the minority carrier life time will be the deterministic factor of how fast the device can be turned off. GaN is a direct bandgap material the e-barrier (also referred to as the "parasitic P layer,") between the n-InAlN layer and the n-GaN layer shown in FIG. 3A is very thin. The parasitic P layer is not a p-doped layer per se, but the polarization interface effectively acts as a p-doped layer. Since the parasitic P layer is very thin, the minority carriers can be eliminated rapidly. In some embodiments, the series resistance of the heterostructure can function as the R in FIG. 11. In some embodiments, the junction capacitance of the N (parasitic P layer+N) NP structure as shown in FIG. 3A can be used as the capacitor C in FIG. 11. This provides a high frequency, self-oscillating, radio-frequency source. The proposed GaN device can be used in other applications such as providing a triggering threshold.

Figure 12:
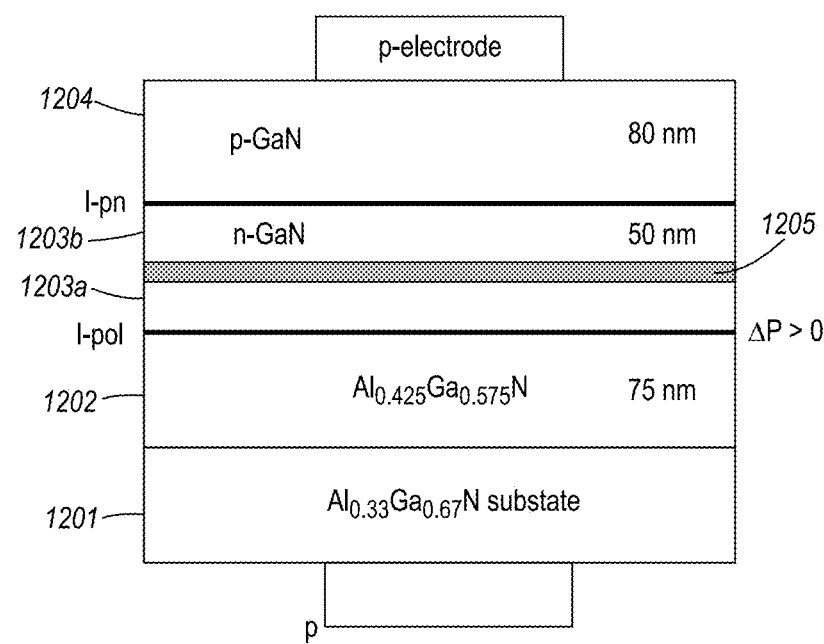
FIG. 12 illustrates a PCD light emitting device in accordance with some embodiments.

FIG. 12 illustrates a PCD 1200 configured as a light emitting diode (LED). Device 1200 includes first substrate layer 1201 of AlGaN, e.g., $Al_{0.33}Ga_{0.87}$N, a second layer 1202 of AlGaN, e.g., n-type $Al_{0.425}Ga_{0.575}$N, a third layer 1203 comprising two GaN sublayers, 1203a, 1203b with an active region 1205 configured to emit light comprising InGaN quantum wells sandwiched in between the sublayers 1203a, 1203b, and a fourth layer 1204 comprising p-GaN. A pn junction, Ipn, is formed by the homojunction interface between the third 1203 and fourth 1204 layers. A polarization junction, Ipol, is formed by the heterojunction interface between the second 1202 and third 1203 layers. The device shown in FIG. 12 can be used in the circuit shown in FIG. 11 to build a blinking light source.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A device comprising:
   a first layer comprising a group III-nitride semiconductor substrate or template;
   a second group III-nitride semiconductor layer disposed over the group III-nitride semiconductor substrate or template;
   a third group III-nitride semiconductor layer disposed over the second group III-nitride semiconductor layer;
   a fourth group III-nitride semiconductor layer disposed over the third group III-nitride semiconductor layer;
   a pn junction at an interface between the third and fourth group III-nitride semiconductor layers; and
   a polarization hetero-junction between the second group III-nitride semiconductor layer and the third group III-nitride semiconductor layer, the polarization junction having fixed charges of a polarity on one side of the polarization junction and fixed charges of an opposite polarity on an opposite side of the polarization junction; wherein, when unbiased, the pn junction comprises a first electric field that opposes the flow of carriers across the pn junction and the polarization junction comprises a second electric field that opposes the flow of oppositely charged carriers across the polarization junction.

2. The device of claim 1, wherein a distance between pn junction and the polarization junction is between 25 nm and 500 nm.

3. The device of claim 1, wherein:
   the second group III-nitride semiconductor layer is a InAlN layer;
   the third group III-nitride semiconductor layer is an GaN layer; and
   the fourth group III-nitride semiconductor layer is a GaN layer.

4. The device of claim 1, wherein:
   the second group III-nitride semiconductor layer is an AlGaN layer;
   the third group III-nitride semiconductor layer is a GaN layer; and
   the fourth group III-nitride semiconductor layer is a GaN layer.

5. The device of claim 1, wherein a difference in polarization between the second and third group III-nitride semiconductor layers at the polarization junction is greater than about 2.0 C/m$^2$.

6. The device of claim 1, wherein a difference in polarization between the second and third group III-nitride semiconductor layers at the polarization junction is greater than about 3.0 C/m$^2$.

7. The device of claim 1, wherein the second group III-nitride semiconductor layer is a quarternary layer.

8. The device of claim 1, further comprising an active region disposed between the polarization junction and the pn junction, the active region configured to emit light.

9. The device of claim 1, wherein:
   the second group III-nitride semiconductor layer is n doped, the third group III-nitride semiconductor layer is n doped and the fourth group III-nitride semiconductor is p doped; or
   the second nitride semiconductor layer is p doped, the third nitride semiconductor layer is p doped and the fourth nitride semiconductor is n doped.

10. The device of claim 9, wherein a doping concentration of n-doped layers on the order of $10^{18}$ to $10^{19}$ and a doping concentration of p-doped layers on the order of $10^{19}$ to $10^{20}$.

11. The device of claim 1, further comprising an interlayer disposed between the second and third layers.

12. The device of claim 11, wherein the second layer is InAlN and the interlayer is InAlGaN.

13. The device of claim 1, wherein exposure to an environmental condition decreases one or both of the first electric field and the second electric field.

14. The sensor of claim 13, wherein the environmental condition comprises one or more of a chemical, illumination, temperature, and stress condition.

15. The sensor of claim 13, wherein:
   the environmental condition comprises UV illumination;
   the fourth layer is at least partially transparent to the UV illumination.

16. The device of claim 1, wherein a difference between a switch on voltage and a switch off voltage of the device is in a range between 0.010 and 0.002 V.

17. The device of claim 16, wherein a transition from the switch off voltage to the switch on voltage causes a change in current density by a factor of more than $10^3$.

18. The device of claim 17, wherein the InAlN layer is an $In_xAl_{1-x}N$ layer, wherein x is between 0.10 and 0.25.

19. The device of claim 18, wherein the AlGaN layer is an $Al_yGa_{1-y}N$ layer, wherein y is greater than 0.40.

20. A circuit comprising:
   a first layer comprising a group III-nitride semiconductor substrate or template;
   a second group III-nitride semiconductor layer disposed over the group III-nitride semiconductor substrate;
   a third group III-nitride semiconductor layer disposed over the second group III-nitride semiconductor layer;
   a fourth group III-nitride semiconductor layer disposed over the third group III-nitride semiconductor layer;
   a pn junction at an interface between the third and fourth group III-nitride semiconductor layers; and
   a polarization hetero-junction between the second group III-nitride semiconductor layer and the third group III-nitride semiconductor layer, the polarization junction having fixed charges of a polarity on one side of the polarization junction and fixed charges of an opposite polarity on an opposite side of the polarization junction; wherein, when unbiased, the pn junction comprises a first electric field that opposes the flow of carriers across the pn junction and the polarization junction comprises a second electric field that opposes the flow of oppositely charged carriers across the polarization junction;

first and second contacts, the first, second, third, and fourth layers disposed between the first and second contacts;

a voltage source electrically coupled between the first contact and the second contact.

21. The circuit of claim 20, further comprising an active region configured to emit light disposed between the polarization junction and the pn junction.

22. The circuit of claim 20 further comprising one of both of:

a capacitor electrically coupled in parallel with the device; and a resistor or an inductor electrically coupled between the voltage source and the first contact.

* * * * *